(12) United States Patent
Dai et al.

(10) Patent No.: US 11,574,805 B2
(45) Date of Patent: Feb. 7, 2023

(54) SELECTIVE LIQUIPHOBIC SURFACE MODIFICATION OF SUBSTRATES

(71) Applicant: Brewer Science, Inc., Rolla, MO (US)

(72) Inventors: Jinhua Dai, Rolla, MO (US); Joyce A. Lowes, Rosebud, MO (US); Reuben Chacko, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 0 days.

(21) Appl. No.: 16/865,159

(22) Filed: May 1, 2020

(65) Prior Publication Data

US 2021/0082683 A1 Mar. 18, 2021

Related U.S. Application Data

(60) Provisional application No. 62/899,482, filed on Sep. 12, 2019.

(51) Int. Cl.
*H01L 21/02* (2006.01)
*C08F 220/68* (2006.01)
(Continued)

(52) U.S. Cl.
CPC ........ *H01L 21/0212* (2013.01); *C08F 220/68* (2013.01); *C09D 133/16* (2013.01);
(Continued)

(58) Field of Classification Search
None
See application file for complete search history.

(56) References Cited

U.S. PATENT DOCUMENTS 5,030,684 A * 7/1991 Rauch-Puntigam ........................ C08F 220/12 524/513
5,324,803 A * 6/1994 Sawada ..................... C08F 4/34 526/231

(Continued)

FOREIGN PATENT DOCUMENTS

CN 104403453 3/2015
CN 109267041 1/2019
(Continued)

OTHER PUBLICATIONS

Zhang et al., "Selective spin-on deposition of polymers on heterogeneous surfaces," Proc SPIE 10960, Advances in Patterning Materials and Processes XXXVI, 109600Q (Mar. 25, 2019), 11 pages.
(Continued)

*Primary Examiner* — Erik Kielin
(74) *Attorney, Agent, or Firm* — Hovey Williams LLP

(57) ABSTRACT

Materials and methods for modifying semiconducting substrate surfaces in order to dramatically change surface energy are provided. Preferred materials include perfluorocarbon molecules or polymers with various functional groups. The functional groups (carboxylic acids, hydroxyls, epoxies, aldehydes, and/or thiols) attach materials to the substrate surface by physical adsorption or chemical bonding, while the perfluorocarbon components contribute to low surface energy. Utilization of the disclosed materials and methods allows rapid transformation of surface properties from hydrophilic to hydrophobic (water contact angle 120° and PGMEA contact angle) 70°. Selective liquiphobic modifications of copper over Si/SiOx, TiOx over Si/SiOx, and SiN over SiOx are also demonstrated.

19 Claims, 5 Drawing Sheets

(51) Int. Cl.
*H01L 23/31* (2006.01)
*H01L 23/29* (2006.01)
*C09D 133/16* (2006.01)

(52) U.S. Cl.
CPC ...... *H01L 21/02282* (2013.01); *H01L 23/293* (2013.01); *H01L 23/3171* (2013.01)

(56) References Cited

U.S. PATENT DOCUMENTS

| | | | |
|---|---|---|---|
| 5,990,012 | A | 11/1999 | Robinson et al. |
| 7,670,894 | B2 | 3/2010 | Rachmady et al. |
| 7,985,475 | B2 | 7/2011 | Dubrow |
| 8,540,889 | B1 | 9/2013 | Hartlove et al. |
| 10,471,396 | B2 | 11/2019 | Onyemauwa et al. |
| 10,562,065 | B1 | 2/2020 | Johnson et al. |
| 2003/0082924 | A1 | 5/2003 | Andideh et al. |
| 2006/0036005 | A1* | 2/2006 | Kanda ................. G03F 7/2041 430/273.1 |
| 2007/0254236 | A1* | 11/2007 | Allen .................. G03F 7/11 430/273.1 |
| 2008/0299503 | A1* | 12/2008 | Ishiduka ............... G03F 7/11 430/325 |
| 2010/0238246 | A1* | 9/2010 | Ohzeki ................. C09D 11/40 347/102 |
| 2012/0202349 | A1 | 8/2012 | Sun |
| 2012/0301828 | A1* | 11/2012 | Tachibana ............. G03F 7/038 252/587 |
| 2012/0308835 | A1 | 12/2012 | Hong et al. |
| 2013/0011783 | A1 | 1/2013 | Ober et al. |
| 2013/0113086 | A1 | 5/2013 | Bai et al. |
| 2016/0023436 | A1 | 1/2016 | Liu et al. |
| 2020/0002817 | A1 | 1/2020 | Hsu et al. |
| 2020/0142308 | A1 | 5/2020 | Dai et al. |

FOREIGN PATENT DOCUMENTS

| | | | |
|---|---|---|---|
| JP | 2002093945 | 3/2002 | |
| JP | 4883256 | 2/2012 | |
| KR | 101325010 | 11/2013 | |
| KR | 20180136921 | 12/2018 | |
| RU | 2685309 C1 * | 4/2019 | |
| WO | WO-2020128993 A1 * | 6/2020 | ............ C08F 220/34 |

OTHER PUBLICATIONS

Wang et al., "Fluorinated alternatives to long-chain perfluoroalkyl carboxylic acids (PFCAs), perfluoroalkane sulfonic acids (PFSAs) and their potential precursors," Environment International 60 (2013) 242-248, 7 pages.
JP4883256 Machine Translation, 31 pages.
CN104403453 Machine Translation, 14 pages.
JP2002093945 Machine Translation, 26 pages.
KR101325010 Machine Translation, 14 pages.
CN 109267041 Machine Translation, 15 pages.
Zhang et al., "Single-Step, Spin-on Process for High Fidelity and Selective Deposition," ACS Appl. Polym. Mater. 2020, 2, 481-486, 6 pages.
International Search Report and Written Opinion dated Aug. 21, 2020 in corresponding PCT/US2020/031607 filed May 6, 2020, 10 pages.

* cited by examiner

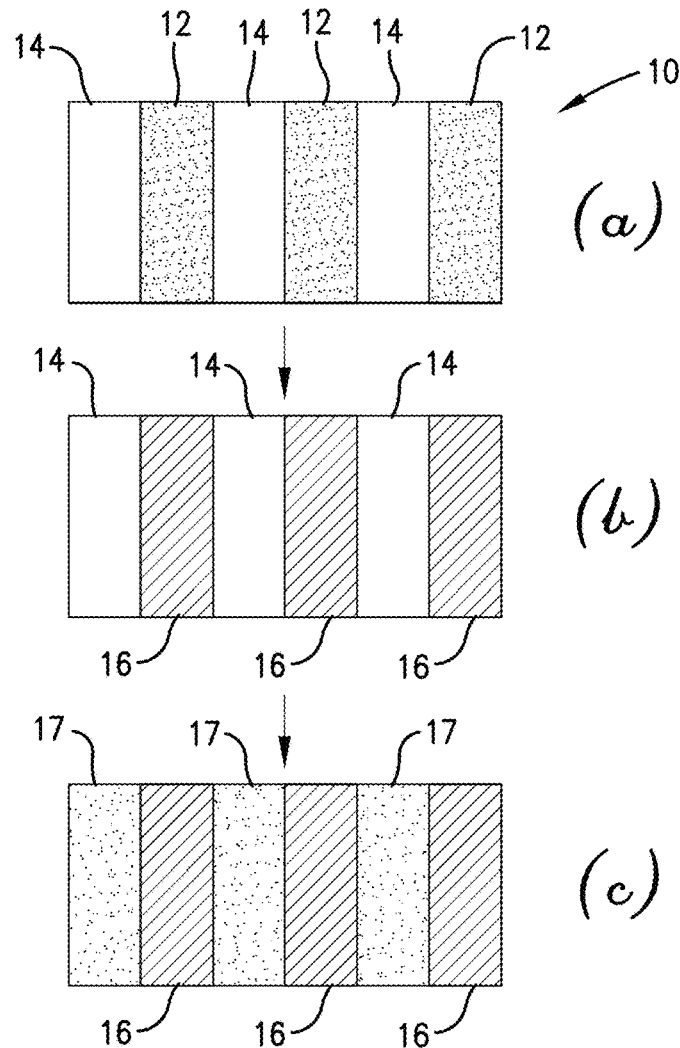
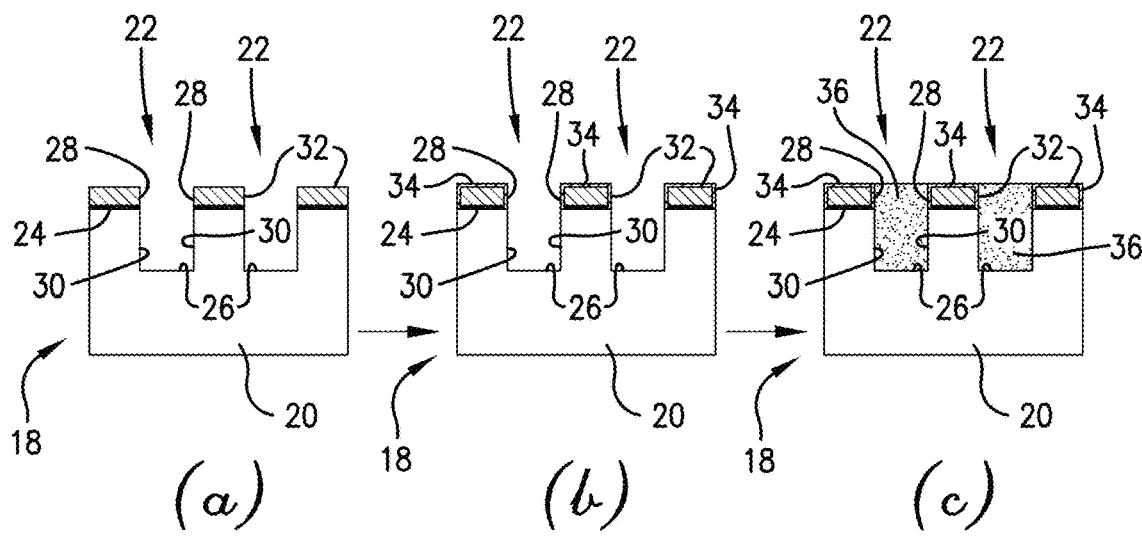

(a) (b) (c)

SELECTIVE LIQUIPHOBIC SURFACE MODIFICATION OF SUBSTRATES

RELATED APPLICATIONS

The present application claims the priority benefit of U.S. Provisional Patent Application Ser. No. 62/899,482, filed Sep. 12, 2019, entitled SELECTIVE LIQUIDPHOBIC SURFACE MODIFICATION OF SUBSTRATES, incorporated by reference in its entirety herein.

BACKGROUND

Field of the Invention

This invention relates in general to methods of fabricating microelectronic structures.

Description of Related Art

Through many methods, achieving high contact angles with water or other solvents is well known. Materials such as those sold under the trade names Rain-X® and Scotchgard™ are readily available, but often fail to provide performance with solvents or offer use for the semiconductor industry. Other materials that have been known to exhibit hydrophobic behavior are derived from silanes, fluorinated compounds, and mixtures of thereof. These types of films require complicated processing and must be applied at thicknesses much greater than can be used in semiconductor processes. Another method of modifying the surface to produce hydrophobic/oleophobic is through creating surface roughness. A further option that does not require fluorinated groups are self-assembled monolayers ("SAMs"). However, lengthy and complicated exposure times are required to achieve high contact angles with SAMs. These materials are not normally processed in a track-friendly solvent and would require a custom module for fab-based processing. Standard SAMs are rather limited commercially and are sensitive to substrate contamination and purity.

There is a need for liquiphobic materials that address the foregoing concerns and can be used in the semiconductor manufacturing industry.

SUMMARY OF THE INVENTION

In one embodiment, a method of forming a structure is provided. The method comprises applying a composition to a first surface having an initial surface energy, with the composition comprising a polymer including at least first and second monomers. The first monomer comprises at least one functional group that chemically bonds with the surface, physically attaches to the surface, or both, and the second monomer is fluorinated and different from the first monomer. The composition is heated to form a layer having a second surface with a second surface energy that is different from the initial surface energy.

In another embodiment, a structure comprising a substrate having a first surface and a coating layer on at least some of the first surface is provided. The coating layer comprises a polymer including at least first and second monomers. The first monomer comprises at least one functional group chemically bonded with the first surface. The second monomer is fluorinated and different from the first monomer. The coating layer has a water contact angle greater than about 90° and a thickness of less than about 30 nm.

A polymer comprising at least first and second recurring monomers different from one another is also provided. The first recurring monomer is chosen from 2-hydroxyethyl methacrylate, hydroxypropyl methacrylate, glycidyl methacrylate, methacrylic acid, acrylic acid, mono-2-(methacryloyloxy)ethyl succinate, 2-(methylthio)ethyl methacrylate, 3-(trimethoxysilyl)propyl methacrylate, 3-[(4-ethenylphenyl)methoxy]-benzaldehyde, 2-(methacryloyloxy)ethyl acetoacetate, and combinations of the foregoing. The second recurring monomer is chosen from 3,5-bis(trifluoromethyl)styrene, 1,1,1,3,3,3-hexafluoroisopropyl methacrylate, where x is 1-15, and combinations of the foregoing.

In a further embodiment, a composition comprising the above polymer dispersed or dissolved in a solvent system is provided.

In yet a further embodiment, the invention provides a method of forming a structure, where the method comprises providing a substrate having a first surface comprising a first region formed of a first material and a second region having an initial surface energy and formed of a second material different from the first material. A surface bonding enhancer layer is selectively formed on the first region and comprises a bonding enhancer compound comprising at least one functional group that chemically bonds with the first region, physically attaches to the first region, or both. The bonding enhancer compound lacks a functional group that chemically bonds with or physically attaches to the second region. A surface energy modifying layer is formed on the surface bonding enhancer layer. The surface energy modifying layer comprises a surface energy modifying compound that is fluorinated and different from the bonding enhancer compound, and the surface energy modifying layer has a second surface with a second surface energy that is different from the initial surface energy.

BRIEF DESCRIPTION OF THE DRAWINGS

FIG. 1 is a schematic depiction (not to scale) of one embodiment of a selective modification process as described herein;

FIG. 2 is a schematic depiction (not to scale) using a selective modification process as described herein for trench filling;

DETAILED DESCRIPTION

Figure 3:
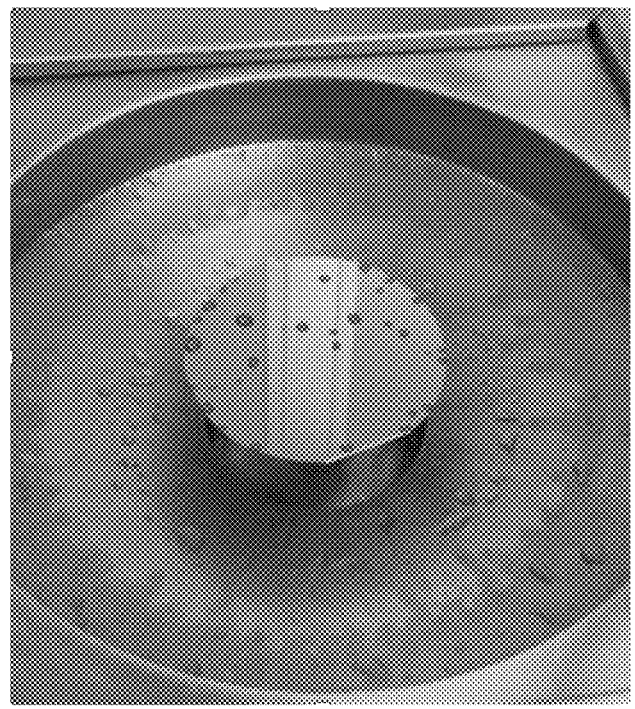
FIG. 3 is a photograph showing the dewetting that was achieved on a modified silicon wafer as described in Example 2.

The present invention is broadly concerned with novel compositions for surface modification of substrates, such as those used in the semiconductor industry.

Compositions

1. Polymeric Embodiment

Preferred polymers used for surface modifications as described herein are copolymers of two or more monomers. These polymers can generically be represented as

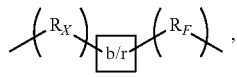

where $R_X$ contains at least one functional group for surface attaching and/or bonding, $R_F$ is a monomer for altering surface energy, and "b/r" designates that the polymer could be a random or block copolymer.

Preferred $R_X$ monomers are preferably selected to enhance surface bonding between the layer formed from the surface modifying composition and the substrate or other layer on which the layer is formed. The $R_X$ monomers will have one or more functional groups able to chemically and/or physically interact with the substrate surface, and it will be appreciated that different $R_X$ monomers may be used for different surfaces. It is especially preferred that $R_X$ adheres to at least one substrate material more strongly than at least one other substrate material.

Preferred $R_X$ monomers include those having functional groups or moieties that are chosen from hydroxys (such as 2-hydroxyethyl methacrylate and/or hydroxypropyl methacrylate); epoxies (such as glycidyl methacrylate); carboxylic acids (such as methacrylic acid, acrylic acid, and/or mono-2-(methacryloyloxy)ethyl succinate); thiols (such as 2-(methylthio)ethyl methacrylate); silanes (such as 3-(trimethoxysilyl)propyl methacrylate); aldehydes (such as 3-[(4-ethenylphenyl)methoxy]-benzaldehyde); acetylacetonates (such as 2-(methacryloyloxy)ethyl acetoacetate); and combinations of the foregoing.

The $R_X$ monomer is preferably present in the polymer at a level of from about 1% to about 90% by mass, more preferably from about 5% to about 50% by mass, and even more preferably from about 10% to about 25% by mass, based on the total mass of the polymer taken as 100%.

$R_F$ monomers are preferably selected to alter the surface energy (preferably by reducing it) of the substrate or other layer on which the layer is formed. Preferred $R_F$ monomers include any fluorinated monomer (and preferably perfluorinated), with that monomer being selected to achieve the desired surface energy. Examples of preferred such monomers include those chosen from 3,5-bis(trifluoromethyl) styrene, 1,1,1,3,3,3-hexafluoroisopropyl methacrylate, and perfluorinated methacrylate/acrylate of structure shown below,

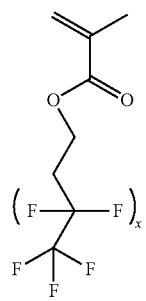

where x is preferably 1-15, more preferably 3-10, and even more preferably 7, and combinations of the foregoing. Two particularly preferred monomers having the above structure include 1H,1H,2H,2H-perfluorodecyl methacrylate ("PFDMA") and 1H,1H,2H,2H-heptadecafluorodecyl acrylate.

The $R_F$ monomer is preferably present in the polymer at a level of from about 10% to about 99% by mass, more preferably from about 50% to about 95% by mass, and even more preferably from about 75% to about 90% by mass, based on the total mass of the polymer taken as 100%.

In some embodiments, a third monomer can be included. These polymers can generically be represented as

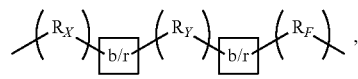

where $R_Y$ is a solubility-enhancing monomer, and $R_X$, $R_F$, and "b/r" are as defined previously.

Preferred $R_Y$ monomers comprise functionalities that have a high solubility in solvents suitable for the particular use, thus improving the solubility of a fluorinated polymer in such solvents. In one embodiment, the $R_Y$ monomers are selected to have high solubility in solvents commonly used in the semiconductor industry (e.g., propylene glycol methyl ether ("PGME"), propylene glycol methyl ether acetate ("PGMEA"), ethyl lactate, and cyclohexanone).

Preferred solubility-enhancing monomers include styrene, methyl methacrylate, methylstyrene, 4-tert-butylstyrene, n-butyl methacrylate, benzyl methacrylate, tert-butyl methacrylate, and combinations thereof.

In embodiments where one or more $R_Y$ monomers are included, they are preferably present up to about 60% by mass, more preferably from about 10% to about 50% by mass, and even more preferably from about 20% to about 30% by mass, based on the total mass of the polymer taken as 100%. In these same embodiments (i.e., where $R_Y$ monomers are included), the $R_X$ monomers are preferably present in the polymer at a level of from about 1% to about 30% by mass, more preferably from about 5% to about 25% by mass, and even more preferably from about 10% to about 20% by mass, and the $R_F$ monomers are preferably present in the polymer at a level of from about 30% to about 90% by mass, more preferably from about 40% to about 80% by mass, and even more preferably from about 50% to about 75% by mass, based on the total mass of the polymer taken as 100%.

In some preferred embodiments, such polymers have the following structure and are formed from the monomers shown (in any combination of those monomers and/or with or without $R_Y$):

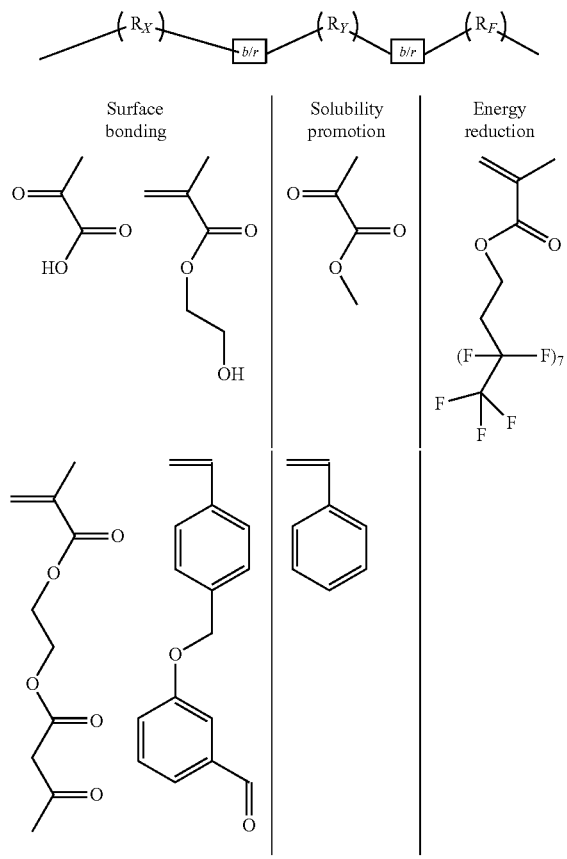

2. Polymer Synthesis

Regardless of the embodiment, the polymers are preferably prepared by free radical polymerization. For random copolymers, the monomers, and an initiator are mixed with a solvent in a flask equipped with $N_2$ purging and a water condenser. Polymerization proceeds at temperatures of from about 60° C. to about 110° C., and more preferably from about 65° C. to 90° C. for a time of from about 2 hours to about 24 hours, and more preferably from about 12 hours to about 18 hours.

For some $R_F$ monomers, random copolymers are not able to yield highly liquiphobic modifications (i.e., water/PG-MEA contact angles approaching 120°/70°). In such cases, block copolymers (BCP) may be used, as noted previously. The same criteria and monomer ratios used for random copolymers may be used for the BCP, and BCP synthesis typically proceeds in three steps. In the first step, a chain transfer agent such as 4-cyano-4-[(dodecylsulfanylthiocarbonyl)sulfanyl]pentanoic acid, an initiator such as AIBN, the $R_X$ monomer, and one or more solvents are preferably mixed in a flask equipped with $N_2$ purging and a water condenser.

The reaction is allowed to proceed at a temperature of from about 60° C. to about 110° C., and preferably from about 65° C. to about 90° C. The temperature of the reaction mixture may be controlled by immersing the flask in an oil bath. Polymerization preferably proceeds for from about 1 hours to about 4 hours, and more preferably about 2 hours.

In the next step, an $N_2$-purged mixture of the $R_Y$ monomer, initiator, and solvent is added to the flask and preferably purged with $N_2$ via a syringe needle and a purge outlet needle. The polymerization is allowed to proceed for from about 2 hours to about 16 hours, and more preferably from about 5 hours to about 10 hours. In some cases, polymers are precipitated to remove monomer residues before moving to the third step.

In the third step, an $N_2$-purged mixture of $R_F$ monomer, initiator, and solvent is added to the flask and purged with $N_2$ via a syringe needle and a purge outlet needle. Polymerization is allowed to proceed preferably from about 2 hours to about 24 hours, and more preferably from to about 16 hours. The final polymer solution is then purified by precipitation and vacuum dried. The dry BCP is then re-dissolved in appropriate solvent (such as MIBK) to prepare mother liquors or formulations.

Suitable initiators for use above include 2,2'-azobis(2-methylpropionitrile) ("AIBN"), 2,2'-azodi(2-methylbutyronitrile) ("AMBN," such as that sold under the name Vazo™ 67 by Chemours), 4,4'-azobis(4-cyanovaleric acid), and/or dicumyl peroxide. The initiator is preferably present in the reaction mixture in an amount of from 0.1% to about 5%, and more preferably from 0.5% to about 3%, as a percentage of the mass of the monomers in the reaction solution taken as 100%.

Suitable polymerization solvents include, but are not limited to, PGMEA, PGME, cyclohexanone, 4-methyl-2-pentanone ("MIBK"), dimethylacetamide ("DMAc"), and combinations thereof. Highly fluorinated polymers are usually difficult to dissolve in common solvents. When $R_X$ is methacrylic acid, DMAc may be used; for other $R_X$ monomers, MIBK may be used.

The weight-average molecular weight (Mw) range of the polymer (as measured by gel permeation chromatography) is preferably from about is 3,000 g/mol to about 20,000 g/mol, and more preferably from about 5,000 g/mol to about 10,000 g/mol.

In one embodiment, the polymer consists essentially of, or even consists of, $R_X$ and $R_F$ monomers. In another embodiment, the polymer consists essentially of, or even consists of $R_X$, $R_Y$, and $R_F$ monomers.

3. Nonpolymeric Embodiment

In one embodiment, the composition used for liquiphobic surface modification is nonpolymeric (e.g., monomers, oligomeric molecules, long chain molecules, etc.). In such instances, the functions of the above-described polymeric surface modifying composition are separated into two layers. The first layer is a surface bonding enhancer layer and comprises a bonding enhancer compound having one or more functional groups able to chemically and/or physically interact with both the substrate surface and a surface energy modifying compound, described below. It will be appreciated that different bonding enhancer compounds may be used for different surfaces. It is especially preferred that the bonding enhancer compound adheres to at least one substrate material more strongly than at least one other substrate material. Suitable such bonding enhancer compounds include polycationic polymers (such as polyethyleneimine, polyallylamine hydrochloride, polydiallyldimethylammonium chloride), polyanionic polymers (such as poly(acrylic acid), poly(methacrylic acid), poly(maleic acid), and reactive polymers (such as poly(maleic anhydride), poly(vinyl alcohol), polyacrylonitrile), and combinations thereof.

The second layer is a surface energy modifying layer and comprises the surface energy modifying compound referenced above, and selected to have a surface energy different from (preferably lower than) that of the first layer. The surface energy modifying compound is different from the bonding enhancer compound of the first layer and is fluorinated (and preferably perfluorinated). Suitable surface energy modifying compounds include, but are not limited to, perfluorononanoic acid ("PNFA"), 6-(perfluorohexyl) hexan-1-ol, allyl 1H,1H-perfluorooctyl ether, 1H,1H-perfluorononylamine, 2,3,4,5,6-pentafluorobenzaldehyde, hexafluoroglutaric anhydride, and combinations of the foregoing.

4. Inventive Compositions

In the polymeric embodiment, the inventive compositions comprise the above-described polymer dispersed or dissolved in a solvent system. In the nonpolymeric embodiment, two separate compositions are formed, with one composition comprising the bonding enhancer compound dispersed or dissolved in a solvent system and the other composition comprising the surface energy modifying compound dispersed or dissolved in a solvent system. In either embodiment, each composition may individually contain optional ingredients, such as those selected from the group comprising crosslinkers, surfactants, polymers, catalysts, additives, and mixtures thereof. In one embodiment, the compositions consist essentially of, or even consist of, the polymer dispersed or dissolved in a solvent system. In another embodiment, the compositions consist essentially of, or even consist of, the bonding enhancer compound dispersed or dissolved in a solvent system. In yet a further embodiment, the compositions consist essentially of, or even consist of, the surface energy modifying compound dispersed or dissolved in a solvent system.

In one embodiment, the composition comprises less than about 5% by weight, preferably less than about 1%, and preferably about 0% silicon, based upon the solids in the composition taken as 100% by weight.

In another embodiment, the composition comprises less than about 5% by weight, preferably less than about 1%, and preferably about 0% nanoparticles, based upon the solids in the composition taken as 100% by weight.

In each of the foregoing compositions, the polymer, bonding enhancer compound, or surface energy modifying compound will preferably be present in the particular composition from about 0.1% to about 10% by weight solids, and more preferably from about 0.5% to about 5% by weight solids, based upon the total weight of the composition taken as 100% by weight.

Preferred solvent systems include a solvent selected from the group consisting of MIBK, MEK, n-butyl acetate, PGMEA, PGME, DMAc, ethyl lactate ("EL"), cyclohexanone, gamma butyrolactone ("GBL"), propylene glycol ethyl ether ("PGEE"), and mixtures thereof. Preferably, the solvent system has a boiling point of from about 100° C. to about 250° C., and more preferably from about 130° C. to about 180° C. The solvent system is preferably utilized at a level of from about 90% to about 99.9% by weight, more preferably from about 95% to 99.5% by weight, based upon the total weight of the composition taken as 100% by weight.

Mixing the above ingredients together in the solvent system forms the particular composition. Furthermore, any optional ingredients (e.g., surfactants) are also dispersed in the solvent system at the same time. The material is preferably filtered before use, such as with a 0.1-μm or 0.2-μm PTFE filter.

Methods of Utilizing Surface Modifying Compositions

A method of modifying a surface is provided. The surface can be on any type of substrate but in a preferred embodiment is a microelectronic substrate, such as a semiconductor substrate. Preferred substrates comprise a material such as silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or combinations of the foregoing. Optional intermediate layers may be formed on the substrate, and it can have a planar surface, with or without topographic features (via holes, trenches, contact holes, raised features, lines, etc.). As used herein, "topography" refers to the height or depth of a structure in or on a substrate surface. In one embodiment, the surface has a first area that comprises a first material, and a second area that comprises a second material. In one embodiment, the substrate is not a nanofiber. In another embodiment, the substrate is not one that includes microneedles (similar to a lotus leaf) on its surface.

A composition useful for forming a surface-energy-modifying layer such as those described above is applied to the substrate surface, or to any intermediate layer that might be on the substrate surface. The composition can be applied by any known application method, with one preferred method being spin coating the composition at speeds preferably from about 1,000 rpm to about 4,000 rpm, more preferably from about 1,500 rpm to about 3,000 rpm, for a time period of preferably from about 10 seconds to about 120 seconds, more preferably from about 30 seconds to about 60 seconds. Optionally, the surface-energy-modifying layer is then baked. Preferred baking conditions preferably involve temperatures from about 60° C. to about 250° C., and more preferably from about 100° C. to about 200° C., and for a time period of from about 10 seconds to about 5 minutes, preferably from about 30 seconds to about 180 seconds. The coating thickness is preferably from about 1 nm to about 300 nm, more preferably from about 2 nm to about 100 nm, and even more preferably from about 3 nm to about 5 nm.

In one embodiment in which nonpolymeric materials are used (i.e., the surface bonding enhancer layer and the surface energy modifying layer described above), the surface bonding enhancer layer is a positively charged polymer surface (essentially functioning as a primer layer), and the surface energy modifying layer is adsorbed onto the positively charged polymer surface. This is demonstrated in Example 4 below, where the use of poly(ethyleneimine) as the bonding enhancer compound is described. A layer of the bonding enhancer compound can be applied by spin coating a composition comprising the bonding enhancer compound in a solvent(s) at speeds preferably from about 1,000 rpm to about 4,000 rpm, more preferably from about 1,500 rpm to about 3,000 rpm, for a time period of preferably from about 10 seconds to about 120 seconds, more preferably from about 30 seconds to about 60 seconds. Optionally, the layer is then baked, thus forming the bonding enhancer layer. Preferred baking conditions preferably involve temperatures from about 60° C. to about 200° C., and more preferably from about 100° C. to about 160° C., and for a time period of from about 10 seconds to about 5 minutes, preferably from about 30 seconds to about 180 seconds. In one preferred embodiment, the layer of the surface bonding enhancer layer may be patterned by photolithography or other means. A layer of the surface energy modifying layer can be applied by spin coating a composition comprising the surface energy modifying compound in a solvent(s) at speeds preferably from about 100 rpm to about 4,000 rpm, more preferably from about 500 rpm to about 3,000 rpm, for a time period of preferably from about 10 seconds to about 120 seconds, more preferably from about 30 seconds to about 60 seconds. Optionally, the layer is then baked to form the surface energy modifying layer. Preferred baking conditions preferably involve temperatures from about 60° C. to about 200° C., and more preferably from about 100° C. to about 160° C., and for a time period of from about 10 seconds to about 5 minutes, preferably from about 30 seconds to about 180 seconds. The surface energy modifying compound selectively adheres to the surface bonding enhancer layer. The coating thickness of the surface bonding enhancer layer is preferably from about 1 nm to about 300 nm, preferably from about 2 nm to about 100 nm, and even more preferably from about 3 nm to about 5 nm, while the thickness of the surface energy modifying layer is preferably from about 1 nm to about 300 nm, more preferably from about 2 nm to about 100 nm, and even more preferably from about 3 nm to about 5 nm.

Regardless of the embodiment, a solvent puddle is optionally performed from about 10 seconds to about 120 seconds, more preferably from about 30 seconds to about 60 seconds. Preferred solvents for the puddle step include water, PGMEA, PGME, MIBK, DMAc, cyclohexanone, and mixtures thereof. The substrate is then dried by spinning at speeds preferably from about 1,000 rpm to about 4,000 rpm, more preferably from about 1,500 rpm to about 3,000 rpm, for a time period of preferably from about 10 seconds to about 300 seconds, more preferably from about 30 seconds to about 60 seconds. This process may be repeated as necessary to remove any excess surface-energy-modifying material. The surface-energy-modifying layer is then baked again. Preferred baking conditions preferably involve temperatures from about 25° C. to about 200° C., and more preferably from about 60° C. to about 160° C. and for a time period of from about 10 seconds to about 300 seconds, preferably from about 30 seconds to about 60 seconds.

After the solvent wash, the surface-energy-modifying layer is preferably only one monolayer thick, that is, the layer is only one molecule adhered to the surface of the substrate. The thickness of the surface-energy-modifying layer is less than about 30 nm, preferably from about 2 nm to about 20 nm, more preferably from about 3 nm to about 5 nm, depending on application needs. It will be appreciated that after processing, the material may be much thinner than after original deposition.

Regardless, the final layer will have a different surface energy (preferably lower) than the surface or layer on which it was formed. That is, a formed layer as described herein will have a static water contact angle of greater than about 90°, and even more preferably greater than about 110°. That is, the formed layer is hydrophobic. In one embodiment, a formed layer as described herein will have a PGMEA static contact angle of higher than 50°, even more preferably higher than 65°. "Static contact angle" is determined using a VCA Optima (available from AST Products) and 0.5 µL droplet.

Regardless of whether the polymeric or nonpolymeric embodiment is utilized, the surface modifying composition can be applied across the entire substrate surface, if desired, but many applications require selective modifications (i.e., modifications to only some areas on the substrate surface). These substrates typically have alternative features (lines, trenches, vias, etc.) of different materials. One such situation is schematically depicted in FIG. 1(a), where a substrate 10 is provided. Substrate 10 has two types of regions or areas: areas 12, which need protection from a processing condition to be carried out, and areas 14, which do not need protection and might even need to be available for such processing. The surface modifying composition described above can be formulated so that it has an affinity to areas 12 but lacks an affinity to areas 14. After application of the composition following the processes described above, a coating 16 is formed on areas 12 (FIG. 1(b)). Such application can cause a surface modification. For example, the surface energy of areas 12 can be lowered by virtue of forming a low-surface-energy coating (i.e., liquiphobic) 16 on areas 12 while avoiding coating formation on areas 14. Any composition that might have been applied to areas 14 can easily be substantially or completely removed from areas 14 because the composition lacks an affinity for areas 14. Suitable removal methods include adhesive tape, rinsing, vacuum, etching, or a combination of the foregoing. Due to the low-surface-energy coating 16 on areas 12, a coating 17 can then be applied selectively to areas 14 but not areas 12 by a method such as spin coating or atomic layer deposition ("ALD") (FIG. 1(c)). Any coating that might have been applied to areas 16 can easily be substantially or completely removed from areas 16 because the composition lacks an affinity for areas 16. Suitable removal methods include adhesive tape, rinsing, vacuum, etching, spinning, or a combination of the foregoing.

In a particularly preferred selective modification application, areas 12 are chosen from materials other than $SiO_x$ (e.g., Cu, TiN, Co, W, Si, and/or SiN) and areas 14 are $SiO_x$. Selective modification of areas 12 but not areas 14 is achievable by selection of the bonding functional group for $R_X$ or for the bonding enhancer compound. For example, when $R_X$ or the bonding enhancer compound is an aldehyde, liquiphobic modification will only occur on the Si area but not on $SiO_x$ areas, such as when a silicon substrate is treated briefly with dilute (1%) aqueous HF acid to remove the native oxide and expose the underlying silicon. When $R_X$ or the bonding enhancer compound is an acetylacetonate (such as 2-(methacryloyloxy)ethyl acetoacetate), selective modification occurs on Cu but not on $SiO_x$, and on TiN but not on $SiO_x$.

After selective modification, modified areas comprise liquiphobic coating thicknesses of from about 3 nm to about 10 nm, and water/PGMEA contact angles of about 120°/70°, while the unmodified areas have no coatings and essentially or completely unchanged water/PGMEA contact angles (for $SiO_x$, that is about 30-50°/0-10°). The modified coatings can tolerate heating at 250° C. in $N_2$ protection for 1 hour with little to no water/PGMEA contact angle changes. The static contact angle difference between modified areas 16 and unmodified areas is preferably at least about 5°, more preferably at least about 20°, and even more preferably at least about 35°. It will be appreciated that both the final surface energy of the modified and unmodified areas, as well as the difference between the final surface energy of the modified and unmodified areas will vary depending on the needs of the subsequent processing steps and materials.

It will be appreciated that selective modifications can be used as a selective protection layer in area-selective atomic layer deposition. For example, a Cu pattern on a substrate selectively modified with a liquiphobic film (such as that described with respect to FIG. 1) is placed into an ALD chamber as in a normal ALD operation. The liquiphobic coating blocks the accessibility of ALD precursors to the Cu, and thus no material is deposited on the Cu. At the same time, normal ALD occurs on un-modified $SiO_x$ areas. In cases where ALD precursors may be physically adsorbed on the liquiphobic surface and cause ALD residue, the residue can be easily detached as described previously.

Selective liquiphobic modification can also be used to achieve trench/gap/via fill with no/minimal overburden on top of open areas. Referring to FIG. 2(a), a structure 18 is schematically depicted. Structure 18 comprises a substrate 20 having trenches 22 formed in its upper surface 24. Each trench 22 has a bottom 26, an upper edge 28, and pair of sidewalls 30 joining its bottom 26 and upper edge 28. Upper surface 24 includes a layer 32 in need of protection prior to application of a fill composition. Thus, a composition according to the invention is selectively applied to the top and sides of layer 32 so as to form surface modifying layer 34 (see FIG. 2 (b)). In one preferred application according to this embodiment, layer 32 is SiN while all other areas are $SiO_x$. SiN-selective liquiphobic surface modifying layer 34 can be carried out as described herein so that only the tops and sides of layer 32 and not the rest of the features are modified. A trench fill material 36 is then applied by spin coating (see FIG. 2(c)). After sufficient fill has been achieved, excess fill material 36 on the liquiphobically modified areas (layer 34) will be almost completely, or even completely, spun off. In the unmodified areas (trenches), normal spin-coating thicknesses will be obtained, thus yielding a structure in which the trenches are fully filled, or substantially fully filled, but the open areas outside of trenches are clean. Random residue on modified areas (layer 34) may remain in some instances, but can be easily removed by taping, vacuum, rinsing, or other methods, due to weak adhesion between the residue and liquiphobic surface of layer 32.

Additional advantages of the various embodiments of the invention will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments but is not necessarily included. Thus, the present invention encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the invention. It is to be understood, however, that these examples are provided by way of illustration and nothing therein should be taken as a limitation upon the overall scope of the invention.

Example 1

Liquiphobic Modification on Silicon Wafer Through Physical Adsorption

A 50% poly(ethyleneimine) ("PEI") solution (Sigma-Aldrich, St. Louis, Mo., 50% in water) was diluted with an 80:20 mixture of water and PGME (Brewer Science, Inc, Rolla, Mo.) to 1%. A 0.1% perfluorononanoic acid ("PFNA," Sigma-Aldrich, St. Louis, Mo.) was prepared by dissolving it in PGME.

The PEI material was spin-coated onto a 100-mm silicon wafer by spin-coating at 1,500 rpm for 60 seconds. It was then baked at 205° C. for 60 seconds on a hot plate. The coated wafer was washed with water by puddling twice for 30 seconds, spun dry, and baked at 150° C. for 60 seconds, yielding a 2.1 nm±0.2 nm thin film. On the PEI-modified silicon wafer, the 0.1% PFNA material was spin-coated at 500 rpm for 60 seconds, followed by 1,500 rpm spin for 60 seconds. The wafer was then baked at 130° C. for 60 seconds, washed with PGME by puddling for 30 seconds, spun dry, and baked at 130° C. for 60 seconds, yielding a film thickness of 2.5. nm±0.2 nm as measured by ellipsometry. Static contact angles on the modified surface were: for water, 90°±1°; for kerosene, 59°±1°; and for PGMEA, 61°±1°.

Example 2

Coatability Comparison Between Modified and Unmodified Silicon Wafer

In this procedure, a 6.7% mixture of a spin-on carbon material ("SOC") dissolved in PGMEA (Brewer Science, Rolla, Mo.) was spin coated onto both an untreated silicon wafer and a liquiphobic modified wafer prepared as described in Example 1. Spin coating off the SOC mixture took place at 1,500 rpm for 60 seconds followed by baking at 205° C. for 60 seconds. The thickness change (measured with an ellipsometer) of the untreated wafer was 143 nm, while the thickness change on the liquiphobic-modified wafer was zero, indicating that the wafer with the modified surface was not coatable. FIG. 3 shows an image of the solution as it was dispensed on the modified wafer, and it can be seen that the solution beaded on the surface.

Example 3

Photopatterning Polymer: Synthesis, Formulation, and Photosensitivity Test

In this Example, 20.0 grams of tert-butyl methacrylate (Sigma-Aldrich, St. Louis, Mo.), 5.0 grams of glycidyl methacrylate (Sigma-Aldrich, St. Louis, Mo.), 0.5 gram of 2,2'-azobis(2-methylpropionitrile) ("AIBN," Sigma-Aldrich, St. Louis, Mo.), and 59.0 grams of PGMEA were mixed together. The methacrylate monomers were polymerized to form poly(tert-butyl methacrylate-co-glycidyl methacrylate) using free radical polymerization by reacting at 65° C. for 16 hours in a 3-neck round bottom flask equipped with water condenser and $N_2$ purging. The polymer mother liquor was used directly for formulations without purification.

Next, 10.0 grams of the polymer mother liquor, 90 milligrams TPS-C1 PAG, and 290.0 grams of PGMEA were mixed on a rotation wheel overnight and filtered through a 0.2-μm PTFE membrane.

The formulation was coated on two 100-mm silicon wafers by spin coating at 1,500 rpm for 60 seconds and baked on a hot plate at 205° C. for 60 seconds. The coating was measured by ellipsometry, giving a thickness of 30.4 nm. One wafer was stripped with a 30-second PGMEA puddle and baked at 130° C. for 60 seconds. The thickness after stripping was 30.0 nm, indicating the coating was fully crosslinked. The other wafer was exposed at a dose of 100 mJ/cm² (Hg—Xe light source, broadband), post-exposure baked at 168° C. for 60 seconds, developed with 30-second PGMEA puddle, and soft baked at 130° C. for 60 seconds. The thickness of the coating was measured at 22.5 nm. The 25% thickness loss was attributed to the de-protection of tert-butyl methacrylate.

Example 4

Self-Assembly of Polymer Solution on Alternatively Liquiphobic/Liquiphilic Pattern This experiment was designed to monitor thickness change of each step toward self-assembly of polymer solutions on a liquiphobic/liquiphilic pattern. A wafer coated with the material from Example 3 was half blocked with opaque rubber and half exposed (Hg—Xe light source, broadband) at 100 mJ/cm², and then post-exposure baked at 168° C. for 60 seconds. The coating thickness on the blocked half had a thickness of 30.1 nm, while the thickness on the exposed half was 22.7 nm, indicating successful de-protection of tert-butyl methacrylate and conversion from ester (electrically neutral) to acid (neutral but acidic). The wafer was PGMEA puddled for 30 seconds, spun dry, and soft baked at 130° C. for 60 seconds. The coating thicknesses on both halves had no measurable change, indicating that the coating was not solvent strippable.

The 1% PEI from Example 1 was then coated at 1,500 rpm for 60 seconds, and the wafer was baked at 130° C. for 60 seconds. The thickness of the polymer coating on the side that was exposed was 70.5 nm, while the thickness of the polymer coating on the blocked half was 35.1 nm. This dramatic thickness difference in the PEI layer on the blocked half compared to the exposed half was attributed to the surface energy difference of the two halves. The exposed half was carboxylic acid, which has stronger interactions with PEI (a partially protonated base); the blocked half was a tert-butyl ester, which is hydrophobic and electrically neutral. The PEI-coated wafer was then washed twice using a 30-second water puddle, spun dry, and baked at 130° C. for 60 seconds. The film thicknesses on the exposed half and blocked half were 27.6 nm and 30.1 nm, respectively. This result indicates that PEI adsorption on the exposed half was about 5 nm but negligible on the blocked half. Now a half positively charged/half neutral substrate was ready for liquiphobic/liquiphilic patterning.

On the PEI-primed wafer described above, 0.1% PFNA was coated at 500 rpm for 60 seconds followed by spinning at 1,500 rpm for 60 seconds. The wafer was then baked at 130° C. for 60 seconds, followed by washing with a 30-second PGME puddle and baking at 130° C. for 60 seconds. Thickness changes on the exposed half (<1 nm) and the blocked half (not measurable) had no manifest difference. However, the surface property of the two halves after the PFNA modification differed dramatically. When the 6.7% SOC solution from Example 2 was coated at 1,500 rpm for 60 seconds and then baked at 130° C. for 60 seconds, the thickness on the liquiphobic-modified half (exposed half) had no change, while the thickness on liquiphilic-half (blocked half) changed from 30.2 nm to 230.3 nm. The first part of this experiment is summarized in Table 1.

TABLE 1

Coating thickness on exposed and blocked portions

| Operations | Thickness after operation (nm) | |
|---|---|---|
| | Exposed half | Blocked half |
| 100 mJ/cm², PEB at 168° C. for 60 s | 22.7 | 30.1 |
| 30-s PGMEA puddle, bake at 130° C. for 60 s | 22.7 | 30.1 |
| Spin coat 1% PEI, bake at 130° C. for 60 s | 70.5 | 35.1 |
| 2 × 30-s water puddle, bake at 130° C. for 60 s | 27.8 | 30.2 |
| PFNA coat and wash | 28.0 | 30.2 |
| 6.7% SOC, bake at 130° C. for 60 s | 28.0 | 230.3 |

Figure 4:
FIG. 4 is a photograph showing the surface of a wafer after being coated with a spin-on carbon material but before spinning (Example 4)
Figure 5:
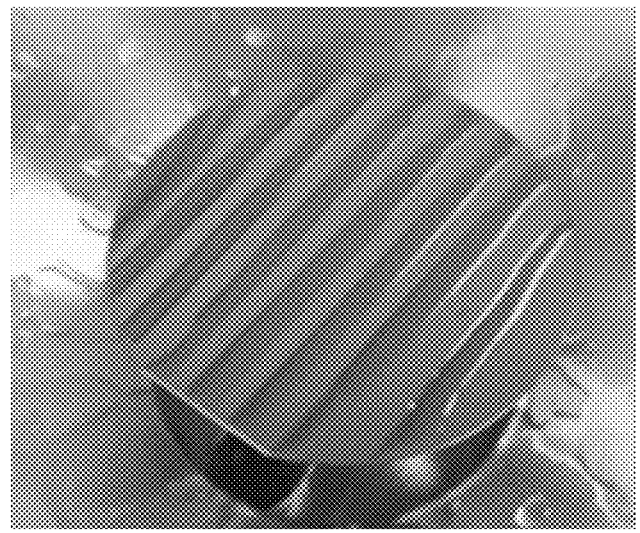
FIG. 5 is a photograph showing the same wafer of FIG. 4 but after spinning.
Figure 6:
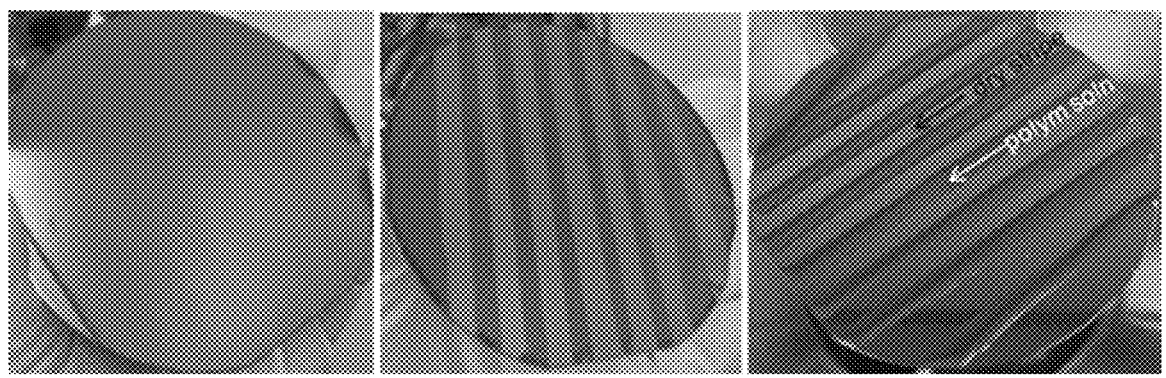
FIG. 6 is a series of photographs showing: (a) photopatterned poly(methacrylic acid)/poly(tert-butyl methacrylate) on a silicon wafer; (b) poly(ethyleneimine) (darker stripes) coated on the wafer, before water washing; and (c) spin-on carbon material patterns (Example 4)

Next, self-assembly of polymer solutions on liquiphobic/liquiphilic patterns at the millimeter to micrometer scales were demonstrated. For millimeter patterns, a wafer coated with the material from Example 3 was covered with silicon stripes (obtained by cutting a 100-mm Si wafer) of about 6-mm width. The steps shown in Table 1, including photo exposure, PEI priming, and PFNA adsorption (liquiphobic modification) were performed. The wafer was then coated with 6.7% SOC, and the solution was slowly (100 rpm for 5 seconds) spun off. The solution that remained on the wafer automatically moved from the liquiphobic stripes to the liquiphilic stripes in a second and stabilized there. FIG. 4 shows the wafer before spinning, and FIG. 5 shows the wafer approximately one second after spinning. FIG. 6 shows the patterns after exposure (on the left), the PEI coating (in the middle, image shown is before water washing for sharper contrast), and the SOC solution pattern (on the right).

Figure 7:
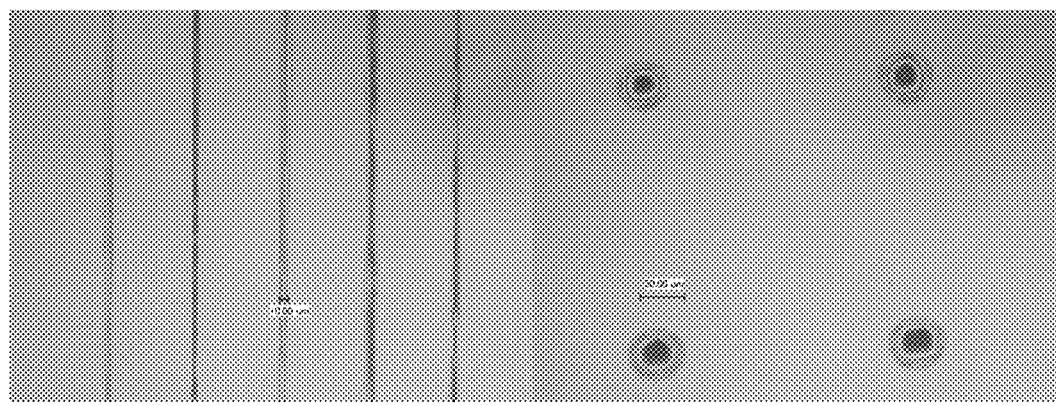
FIG. 7 is a set of optical microscope images showing polymer patterns obtained as described in Example 4, where the lines (left) were 10 μm wide and 600 nm thick, and the round dies (right) were 50 μm in diameter and 600 nm thick.

For micrometer patterns, a chrome-patterned contact photo mask was placed on a wafer coated with the material from Example 3. The wafer was processed as for millimeter patterns described in the prior paragraph. The polymer solution patterned wafer was baked at 100° C. for 3 minutes to drive away solvents. FIG. 7 shows optical microscope images of polymer patterns obtained (Lines: 10 μm wide, 600 nm thick; round dies: 50 μm dia., 600 nm thick).

Example 5

Synthesis of Random Copolymers 5A and 5B and Liquiphobicity Test

HEMA-co-styrene-co-PFDMA was synthesized by adding 2-hydroxyethyl methacrylate ("HEMA," Sigma-Aldrich, St. Louis, Mo.), AIBN, styrene (Sigma-Aldrich, St. Louis, Mo.), 1H,1H,2H,2H-perfluorodecyl methacrylate (PFDMA, Synquestlabs, Alachua, Fla.), and 4-methyl-2-pentanone (MIBK, Sigma-Aldrich, St. Louis, Mo.) to a 3-neck round-bottom flask equipped with water condenser and nitrogen purging. The amounts of monomers and catalysts for materials 5A and 5B are shown in Table 2. Free radical polymerization was allowed to occur at 65° C. for 16 hours. The synthesized polymer solutions were used directly for formulations without purification.

TABLE 2

Reactant Amounts in Example 5

| Polymer # | AIBN (g) | HEMA (g) | Styrene (g) | PFDMA (g) | MIBK (g) |
|---|---|---|---|---|---|
| 5A | 0.24 | 0.53 | 4.74 | 5.40 | 20.0 |
| 5B | 0.23 | 0.57 | 2.04 | 7.67 | 21.6 |

To test the liquiphobicity of the random copolymers 5A and 5B, 1% polymer in MIBK was coated on silicon wafers at 1,500 rpm for 60 seconds and the wafers were baked at 205° C. for 60 seconds. The wafers were puddled with MIBK twice for 30 seconds, spun dry, and baked at 130° C. for 60 seconds, producing 3.0-nm-thick films bonded onto the silicon wafer surface. The molecular weight of the polymers, as well as water and PGMEA contact angles, were measured (VCA Optima, AST Products) and are listed in Table 3.

TABLE 3

Properties of Polymers from Example 3

| Polymer | Mw/PD | Contact angle (°) | |
|---|---|---|---|
| | | Water | PGMEA |
| 5A | 20.0k/2.57 | 103 ± 1 | 31 ± 1 |
| 5B | 13.0k/1.92 | 109 ± 1 | 55 ± 1 |

Example 6

Synthesis of Random Copolymer 6

AAEM-co-PFDMA was synthesized by adding 0.92 gram of 2-(methacryloyloxy)ethyl acetoacetate ("AAEM," Sigma Aldrich, St. Louis, Mo.), 2.73 grams of PFDMA, 63 milligrams of AIBN, and 10.9 grams of MIBK to a 2-neck flask equipped with $N_2$ purging and water condenser. Polymerization proceeded at 65° C. for 16 hours. Formulation and application for surface modification are described in Example 12 (selective liquid phobic modifications of TiN/SiOx and Cu/SiOx.)

Example 7

Synthesis of Gradient Block Copolymer MAA-b-MMA-b-PFDMA and Liquiphobicity Test

Synthesis of gradient block copolymer MAA-b-MMA-b-PFDMA was performed in 3 steps. First, 0.80 gram of 4-cyano-4-[(dodecylsulfanylthiocarbonyl)sulfanyl]pentanoic acid (chain transfer agent; Boron Molecular, Raleigh, N.C.), 60 milligrams of AIBN initiator, 1.0 gram of the methacrylic acid (Sigma-Aldrich, St. Louis, Mo.) monomer, 8.0 grams of PGMEA solvent, and 2.0 grams of PGME solvent were mixed in a 100-mL 2-neck flask equipped with $N_2$ and water condenser. After 30 minutes of $N_2$ purging, the flask was immersed in an oil bath at a temperature of 65° C. Polymerization proceeded for 2 hours, after which the polymer was not precipitated so that some MAA would be available for the next polymerization step. Next, a $N_2$-purged mixture of 4.0 grams of methyl methacrylate ("MMA," Sigma-Aldrich, St. Louis, Mo.), 20 milligrams of AIBN, and 10 grams of PGMEA were purged with $N_2$ in the 2-neck round-bottom flask using a $N_2$ inlet and outlet needles, and the polymerization was allowed to proceed for 7 hours. Finally, the $N_2$ purged mixture of 50 grams of PFDMA, 20 milligrams of AIBN, and 10 grams of PGMEA was prepared and purged with $N_2$ in the 2-neck round-bottom flask as described above, and the polymerization proceeded for another 14 hours. The polymer solution was then cooled to room temperature, precipitated into hexane (Sigma-Aldrich, St. Louis, Mo.), and washed with hexane. The final solution was vacuum dried at room temperature for 16 hours, yielding 8.8 grams of dry powder polymer (83% yield).

The polymer was dissolved in MIBK to prepare a 1.0% polymer solution. Dissolution was facilitated by stirring at 60° C. for 2 hours, then cooled to room temperature. Samples were filtered through a 0.2-µm PTFE filter.

A 100-mm silicon wafer was coated with the 1.0% PEI in water (from Example 1) by spin coating at 1,500 rpm for 60 seconds, then baked at 130° C. for 60 seconds, yielding a 25.0-nm coating as measured by ellipsometry. Next, the wafer was washed twice with 30-second water puddles, and then baked at 130° C. for 60 seconds, yielding a thickness of 8.0 nm as measured by ellipsometry. The 1.0% MAA-b-MMA-b-PFDMA sample prepared above was then coated on the PEI-primed wafer by spin coating at 1,500 rpm for 60 seconds, and it was baked at 112° C. for 60 seconds, yielding a 35.0-nm thick film as measured by ellipsometry. The wafer was washed twice with 30-second MIBK puddles, then baked at 130° C. for 60 seconds, yielding a 13.2-nm thick coating. Water and PGMEA static contact angles were measured as 119°±1° and 72°±2°, respectively. It is noteworthy that a random copolymer MAA-co-MMA-co-PFDMA of similar monomer ratio (1/4/5) gives water/PGMEA contact angles of only 95°/40° under same processing conditions. For a block copolymer, the carboxylic acid (MAA) block is attached to PEI while the low surface energy component (PFDMA) aligns and piles on the very top surface, yielding high contact angle. For a random copolymer, the polymer chains are likely stacked horizontally, and the non-fluorinated components (MMA, MAA) are possibly partially available to applied liquids (water, PGMEA, etc.).

Example 8

Synthesis of Gradient Block Copolymer HEMA-b-MMA-b-PFDMA and Liquiphobicity Test Synthesis of a gradient block copolymer, HEMA-b-MMA-b-PFDMA, was performed in 3 steps. First, 1.5 grams of 4-cyano-4-[(dodecylsulfanylthiocarbonyl)sulfanyl]pentanoic acid (chain transfer agent; Boron Molecular, Raleigh, N.C.), 0.13 gram of AIBN initiator, 1.5 grams of the HEMA monomer, 1.5 grams of MMA monomer, 16.0 grams of PGMEA solvent, and 4.0 grams of PGME solvent were mixed in a 100-mL 2-neck flask equipped with $N_2$ and water condenser. After 30 minutes of $N_2$ purging, the flask was immersed in an oil bath at a temperature of 65° C. Polymerization proceeded for 3 hours. Second, 4.0 grams of an $N_2$-purged mixture of 15 grams of MMA monomer, 60 milligrams of AIBN, 16 grams of PGMEA, and 4.0 grams of PGME were prepared, and the contents of the 2-neck round-bottom flask were purged with $N_2$. This polymerization was allowed to proceed for 7 hours. Finally, an $N_2$-purged mixture of 12 grams of PFDMA, 60 milligrams of AIBN, 16 grams of PGMEA, and 4.0 grams of PGME were prepared and the contents of the 2-neck round-bottom flask were purged with $N_2$. The polymerization proceeded for another 24 hours. The polymer solution was then cooled to room temperature, precipitated into hexane, and washed with hexane. The final solution was vacuum dried at room temperature for 16 hours, yielding 19.5 grams of dry powder polymer (65% yield).

The polymer was dissolved in MIBK to prepare a 1.0% polymer solution. Dissolution was facilitated by stirring at 60° C. for 2 hours, then cooling to room temperature. Samples were filtered through a 0.2-μm PTFE filter.

The 1.0% HEMA-b-MMA-b-PFDMA sample prepared above was then coated on a blank 100-mm silicon wafer by spin coating at 1,500 rpm for 60 seconds, and it was baked at 185° C. for 60 seconds, yielding a 25.0-nm thick film as measured by ellipsometry. The wafer was then washed twice with 30-second MIBK puddles, followed by baking at 130° C. for 60 seconds, yielding a 7.0-nm thick coating. Water and PGMEA static contact angles were measured as 120°±1° and 72°±2°, respectively.

Example 9

Synthesis of Aldehyde Monomer 3-[(4-ethenylphenyl)methoxy]-benzaldehyde

In this procedure, 30.6 grams of 4-(chloromethyl)styrene (TCI America, Portland Oreg.), 25.62 grams of 3-hydroxybenzaldehyde (Sigma-Aldrich, St. Louis, Mo.), 29.04 grams of potassium carbonate (Alfa Aesar, Tewksbury, Mass.), 1.50 grams of sodium iodide (Alfa Aesar), and 200 grams of acetone (Sigma-Aldrich, St. Louis, Mo.) were added into a 500-mL flask and stirred at 55° C. for 16 hours. The resulting solid was filtered and washed with acetone, and the liquids were combined and passed through an aluminum oxide column. The liquid collected from the aluminum column was concentrated via rotary evaporator and vacuum dried at room temperature, resulting in 33.0 grams of brownish oily product being collected (70% yield). 1HNMR (CDCl$_3$) of the resulting product resulted in peaks at: δ 10.0 (s, 1H), δ 7.5 (m, 7H), δ 7.3 (s, 1H), δ 6.7 (m, 1H), δ 5.8 (d, 1H), δ 5.3 (d, 1H), δ 5.1 (s, 1H).

Example 10

Synthesis of Aldehyde Functionalized Perfluorinated Polymers and Immobilization of the Polymers onto Aminated Surface Through Schiff Base Formation In this Example, 2.6 grams of 3-[(4-ethenylphenyl) methoxy]-benzaldehyde (synthesized in Example 9), 7.6 grams of PFDMA, 28 milligrams of AIBN, and 10.5 grams of MIBK were mixed in a 100 mL 2-neck flask equipped with $N_2$ purging and water condenser. Polymerization proceeded at 90° C. for 17 hours. The obtained polymer solution was used for formulations without purification.

The 1.0% PEI in water from Example 1 was coated on two 100-mm silicon wafers by spin coating at 1,500 rpm for 60 seconds and baked at 130° C. for 60 seconds. The wafers were then washed with water twice by puddling for 30 seconds and baked at 130° C. for 60 seconds. An untreated wafer was used as a control. A 3.0% 3-[(4-ethenylphenyl) methoxy]-benzaldehyde-co-PFDMA solution in MIBK was then coated on the three wafers by spin coating at 1,500 rpm for 60 seconds, and were either not baked, or baked at 100° C. for 60 seconds. The wafers were then washed twice with MIBK by puddling for 30 seconds and then dried by baking at 130° C. for 60 seconds. Water and PGMEA static contact angles were measured and results are shown in Table 4.

TABLE 4

| Process Parameters, Thicknesses, and Contact Angles of Wafers | | | |
|---|---|---|---|
| Wafer ID | 1 | 2 | 3 |
| PEI layer | 1500 rpm for 60 s, 130° C. for 60 s; 2 × 30 s water puddle; 130° C. for 60 s | | |
| PEI thickness | | 8.8 nm (0.1) | 8.8 nm (0.1) |
| Liquiphobic coating | 1,500 rpm for 60 s | | |
| Baking | No bake | No bake | 100° C. for 60 s |
| Liquiphilic thickness | 181.5 nm (0.9) | 192.9 nm (1.0) | 183.9 nm (0.6) |
| Washing | 2 × 30-s MIBK puddle, 130° C., 60 s | | |
| Thickness | ~1 nm | 19.3 nm (0.2) | 33.3 nm (0.7) |
| PGMEA CA | 11.3° | 69.0° | 77.9° |
| Water CA | 23.3° | 119.1° | 121.7° |

Example 11

Selective Liquiphobic Surface Modification of Silicon Nitride Over Silicon Oxide $SiO_x$ (1 μm) on Si wafers and SiN (50 nm) on Si wafers were received from Waferpro (San Jose, Calif.). Wafers were cut into 1"×1" coupons for testing. HF acid etching was performed by using a 1.5% HF aqueous solution (freshly diluted from 50% HF acid (Fisher Scientific, 48-51%)), for two minutes, immediately rinsed with copious water, and blown dry with $N_2$. Liquiphobic modifications were performed within 2 hours after etching.

Unetched and HF-acid-etched coupons were coated with 1.25% 3-[(4-ethenylphenyl) methoxy]-benzaldehyde-co-PFDMA polymer (in MIBK) by spin coating at 1,500 rpm for 60 seconds, followed by baking at 110° C. for 60 seconds, washing with MIBK twice by a 30-second puddle, and baking at 130° C. for 60 seconds. Water and PGMEA contact angles were measured, and the results are shown in Table 5. For un-etched SiOx and SiN coupons, liquiphobic modifications did not take place, as indicated by the low water and PGMEA contact angles. For HF-acid-etched coupons, SiN gave dramatically higher water (118°) and PGMEA (79°) contact angles than SiOx (75° and 43°, respectively), indicating that the aldehyde-functionalized perfluorinated polymer selectively bonded to SiN.

TABLE 5

| PGMEA and Water Contact Angles | | | | |
|---|---|---|---|---|
| | Unetched | | HF-acid-etched | |
| | SiOx | SiN | SiOx | SiN |
| PGMEA Contact Angles | <10° | <10° | 42.9° | 79.3° |
| Water Contact Angles | 50.3° | 33.8° | 74.5° | 117.7° |

Example 12

Selective Liquiphobic Modifications of Various Surfaces

Perfluorinated copolymers having acetylacetonate ("ACAC," Example 6), carboxylic acid (—COOH, Example 7), hydroxyl (—OH, Example 8), and aldehyde (—COH, Example 10) functional groups were formulated and coated on 1"×1" of SiOx, TiN, and Cu coupons by spin coating at 1,500 rpm for 60 seconds, followed by baking at 60, 80, 100, 130, or 168° C. for 60 seconds, washed twice by solvent (MIBK) puddle for 30 seconds, and baked at 130° C. for 60 seconds. Water and PGMEA contact angles were measured on each coupon, and the results are shown in Table 6. Selectivity criteria were determined to be: selectively modified substrate has a water/PGMEA contact angle larger than 110°/50°; the water/PGMEA contact angle difference of the two substrates (i.e., a SiOx substrate compared to a TiN or Cu substrate using the same material and bake temperature as the SiOx substrate) is larger than 55°/35°.

The ACAC-F polymer in a baking range of 60-100° C. and aldehyde-F polymer in a baking range of 60-100° C. selectively modified TiN over SiOx. The ACAC-F polymer in a baking range of 60-100° C., the —COOH—F polymer in a baking range of 80-100° C., and —COH—F in a baking range of 80-100° C. each selectively modified Cu over SiOx. Table 6 shows the water/PGMEA static contact angles of the substrates (SiOx, TiN, Cu) after surface modifications with different liquiphobic polymers.

TABLE 6

Contact Angles of Various Materials

| | | Functional Group/Polymer Source Contact Angles (Water/PGMEA) | | | |
|---|---|---|---|---|---|
| Substrate | Baking (° C.) | ACAC/ Example 6 | —COOH/ Example 7 | —OH/ Example 8 | —COH/ Example 10 |
| SiOx | 60 | 50.3/9.4 | 51.0/19.9 | 70.3/28.1 | 53.2/<10 |
| | 80 | 47.1/15.9 | 52.6/20.2 | 88.5/41.0 | 54.3/13.9 |
| | 100 | 55.6/17.3 | 55.0/19.2 | 99.2/46.2 | 58.9/18.7 |
| | 130 | 119.3/42.7 | 53.5/21.0 | 123.6/74.0 | 83.5/42.1 |
| | 168 | 122.0/58.9 | 78.2/39.6 | 121.6/72.4 | 119.4/74.7 |
| TiN | 60 | 120.0/54.4 | 93.9/40.2 | 71.9/28.8 | 111.1/56.0 |
| | 80 | 113.2/56.1 | 86.5/31.8 | 85.4/37.5 | 118.6/66.0 |
| | 100 | 119.8/53.3 | 93.5/38.2 | 89.5/42.4 | 119.6/67.8 |
| | 130 | 123.1/53.7 | 107.8/55.9 | 104.7/52.8 | 120.9/73.4 |
| | 168 | 122.4/53.4 | 119.4/68.6 | 122.3/69.3 | 119.6/77.1 |
| Cu | 60 | 123.7/72.3 | 115.7/63.4 | 118.4/68.9 | 102.4/51.3 |
| | 80 | 124.1/72.4 | 116.3/66.1 | 117.1/64.2 | 114.7/61.4 |
| | 100 | 123.5/72.0 | 117.1/65.3 | 117.1/66.5 | 120.0/65.9 |
| | 130 | 120.6/72.7 | 117.3/68.0 | 124.9/71.9 | 120.7/71.0 |
| | 168 | 120.1/69.5 | 114.3/65.9 | 122.2/69.9 | 121.9/78.5 |

Example 13

AFM on 50 nm Cu/SiOx Lines

Figure 8:
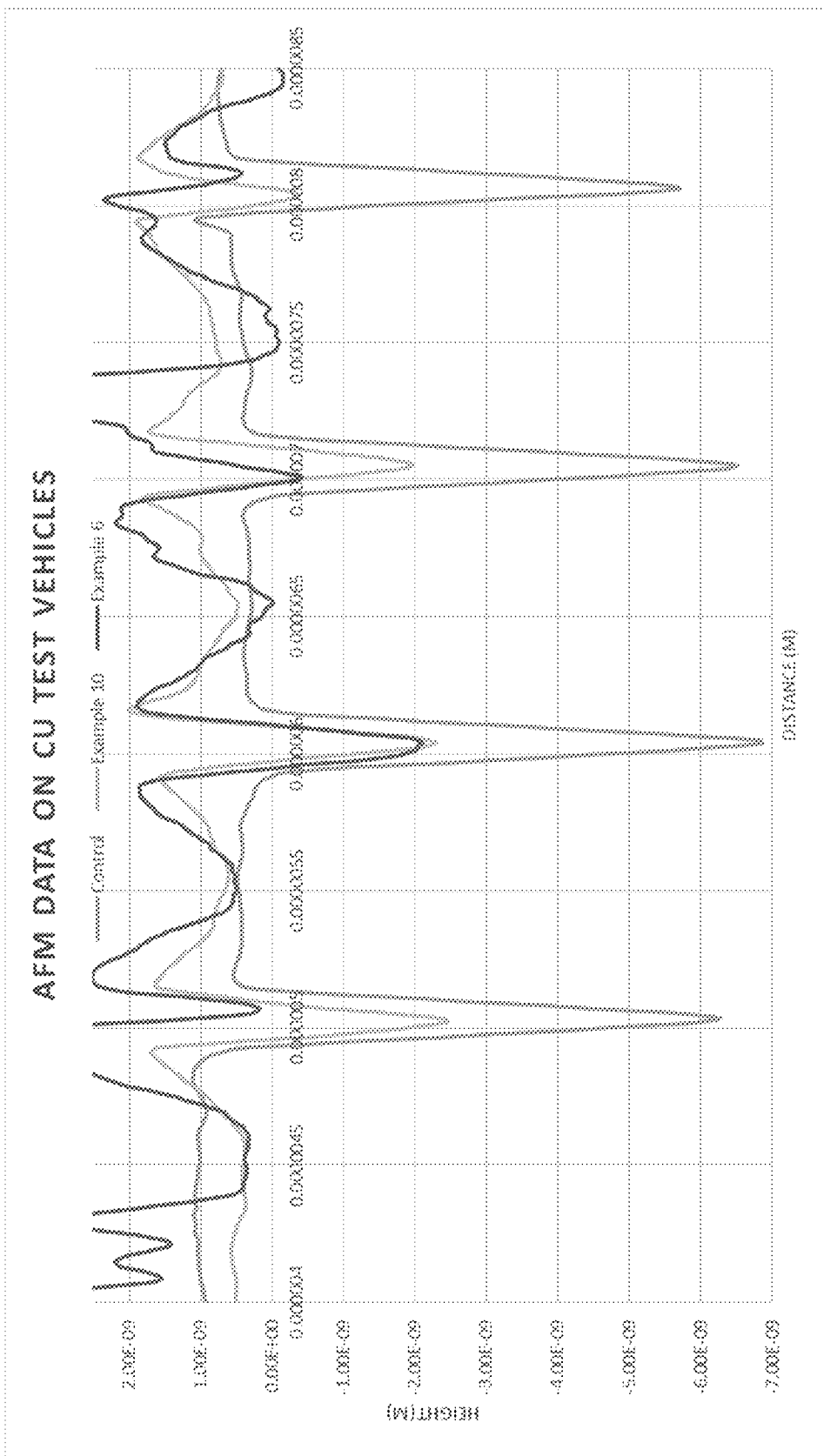
FIG. 8 is a graph of the atomic force microscopy data analysis of feature heights for films selectively grafted over Cu (150 nm) and SiOx barrier layers (890 nm), as described in Example 10.
Figure 9:
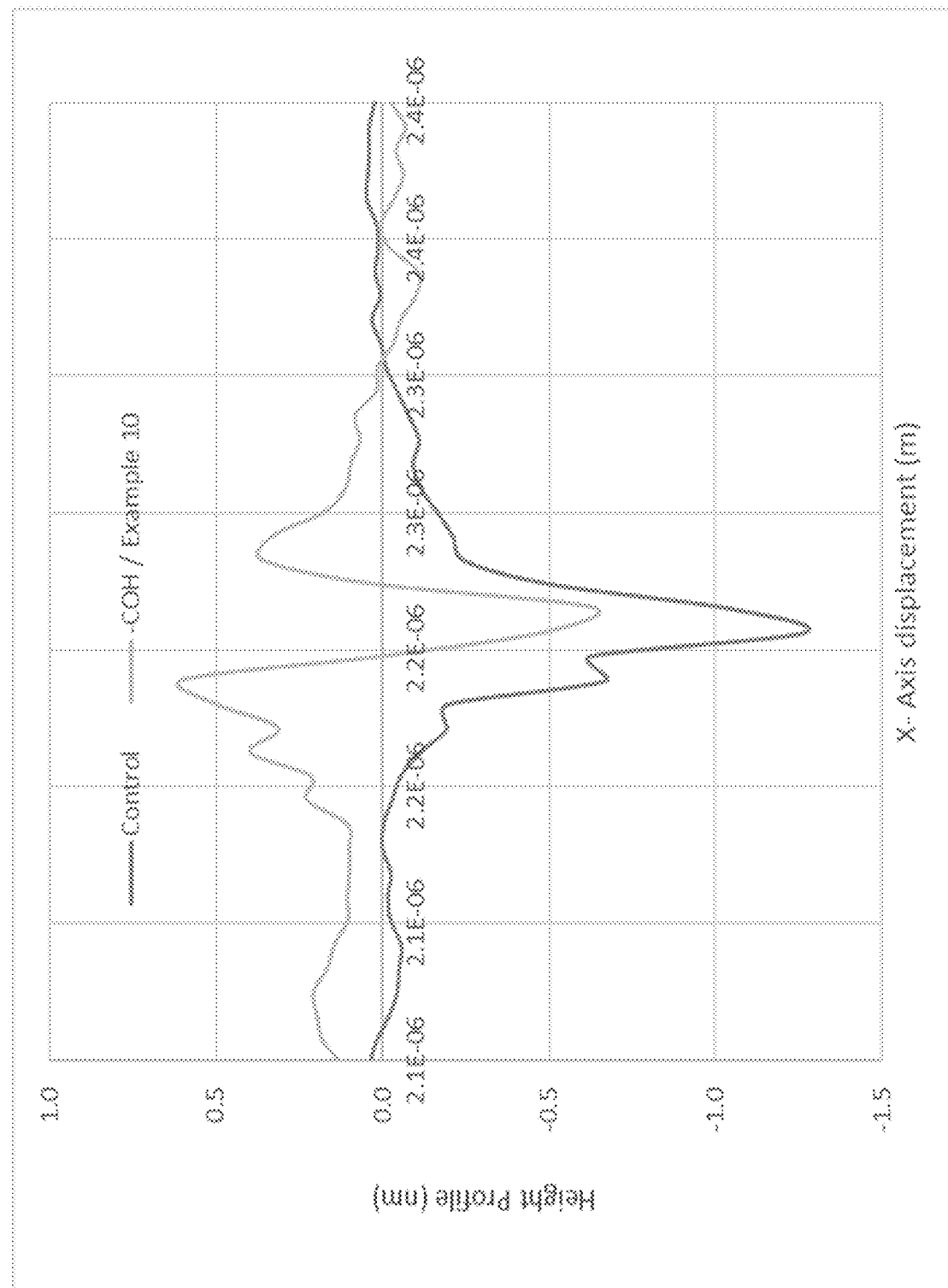
FIG. 9 is a graph of the atomic force microscopy data analysis of feature heights for films selectively grafted over Cu (50 nm) and SiOx barrier layers (250 nm), as described in Example 10.

Patterns of Cu (150 nm) lines with TaN barrier layers and SiOx (900 nm) lines were cleaned by sonication for 5 minutes with acetone, then 10% citric acid (Sigma-Aldrich, St. Louis, Mo.), followed by DI water. The materials from Example 10 and Example 6 were coated and baked at 130° C. for 1 minute. These coupons were rinsed to remove un-grafted polymer as described in previous examples. These features were then analyzed by atomic force microscopy ("AFM"). The tested chemistries selectively grafted to Cu and TaN barrier layers selectively over SiOx. AFM data in FIG. 8 shows a measured thickness of about 4 nm for the films selectively grafted over Cu and TaN barrier layers. The height of the features returns to baseline over SiOx lines when compared to controls, indicating that the material was not grafted to the oxide area of the patterns. Similar experiments were carried out on patterns of Cu (50 nm) lines (with TaN barrier layers) and SiOx (250 nm) lines as well with the material from Example 10. This data is shown in FIG. 9. This data shows that the material from Example 10 is effective at selectively grafting to 50-nm Cu lines with TaN barrier layers with selectivity over oxide.

We claim:

1. A polymer chosen from a copolymer of:
   2-(methacryloyloxy)ethyl acetoacetate and 1H,1H,2H,2H-perfluorodecyl methacrylate; or
   3-[(4-ethenylphenyl)methoxy]-benzaldehyde and 1H,1H,2H,2H-perfluorodecyl methacrylate.

2. A composition comprising the polymer of claim 1 dispersed or dissolved in a solvent system.

3. A method of forming a structure, said method comprising:
   applying a composition to a first surface having an initial surface energy, said composition comprising the polymer according to claim 1; and
   heating said composition to form a layer having a second surface with a second surface energy that is different from said initial surface energy.

4. The method of claim 3, wherein said second surface energy is lower than said initial surface energy.

5. The method of claim 3, wherein said applying comprises spin coating said composition onto said first surface.

6. The method of claim 3, wherein said second surface of said layer has a water contact angle of greater than about 90°.

7. The method of claim 3, wherein said applying comprises selectively applying said composition to some but not all of said first surface.

8. The method of claim 7, wherein said selectively applying is accomplished by including one or both of the following on said first surface:
   one or more areas to which said composition lacks an affinity; and
   one or more areas to which said composition has an affinity.

9. The method of claim 8, wherein:
   said one or more areas to which said composition lacks an affinity comprises at least one SiOx area;
   said one or more areas to which said composition has an affinity comprises at least one non-SiOx area; and
   said selectively applying comprises applying said composition to said at least one non-SiOx area.

10. The method of claim 9, wherein said non-SiOx area comprises Cu, TiN, SiN, Co, W, and mixtures thereof.

11. The method of claim 8, wherein said selectively applying creates an unprotected area where said composition lacks an affinity and a protected area where said composition has an affinity, and further comprising applying a material to said protected and unprotected areas, wherein any material that is applied to said protected area can be substantially removed by spinning, adhesive tape, rinsing, vacuum, etching, or a combination of the foregoing.

12. The method of claim 11, wherein:
   said first surface includes a trench having a bottom, an upper edge, a pair of sidewalls joining said bottom and upper edge, and an upper surface at said upper edge and generally parallel to said bottom;

said protected area is at said upper edge, said upper surface, or both said upper edge and said upper surface;
said unprotected area is at said sidewalls and bottom; and
said material is deposited in said trench so as to fill some or all thereof.

13. The method of claim 3, wherein said first surface is on a semiconductor substrate selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or combinations of the foregoing.

14. A structure comprising:
a substrate having a first surface;
a coating layer on at least some of said first surface, said coating layer:
comprising the polymer according to claim 1; and
having a water contact angle greater than about 90°.

15. The structure of claim 14, wherein said first surface comprises at least one SiOx area and at least one non-SiOx area, said coating layer being on said at least one non-SiOx area.

16. The structure of claim 15, wherein said non-SiOx area comprises Cu, TiN, SiN, Co, W, and mixtures thereof.

17. The structure of claim 14, wherein:
said first surface includes a trench having a bottom, an upper edge, a pair of sidewalls joining said bottom and upper edge, and an upper surface at said upper edge and generally parallel to said bottom;
said coating layer is at said upper edge, said upper surface, or both said upper edge and said upper surface;
said sidewalls and bottom are free of said coating layer; and
a material is deposited in said trench so as to fill some or all thereof.

18. The structure of claim 14, wherein said first surface is on a semiconductor substrate selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or combinations of the foregoing.

19. The structure of claim 14, wherein said polymer is a block copolymer comprising a first block of either said 2-(methacryloyloxy)ethyl acetoacetate or said 3-[(4-ethenylphenyl)methoxy]-benzaldehyde and a second block of said 1H,1H,2H,2H-perfluorodecyl methacrylate, wherein said 1H,1H,2H,2H-perfluorodecyl methacrylate is aligned remote from said first surface.

* * * * *